(12) United States Patent
Hamada et al.

(10) Patent No.: US 6,462,726 B1
(45) Date of Patent: Oct. 8, 2002

(54) VIDEO SIGNAL PROCESSOR

(75) Inventors: Masanori Hamada, Kadoma; Hiroshi Masuda, Kobe, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/622,287

(22) PCT Filed: Feb. 18, 1999

(86) PCT No.: PCT/JP99/00706

§ 371 (c)(1),
(2), (4) Date: Aug. 15, 2000

(87) PCT Pub. No.: WO99/42989

PCT Pub. Date: Aug. 26, 1999

(30) Foreign Application Priority Data

Feb. 19, 1998 (JP) ............................................ 10-036982

(51) Int. Cl.[7] ................................................ G09G 3/38
(52) U.S. Cl. ............................................ 345/98; 345/99
(58) Field of Search ........................... 345/98, 99, 100, 345/87, 94, 204, 200; 348/790, 792, 536, 537

(56) References Cited

U.S. PATENT DOCUMENTS 5,654,735 A * 8/1997 Nakajima ..................... 345/99
5,748,167 A * 5/1998 Watanabe et al. ............. 345/98
6,147,668 A * 11/2000 Eglit ............................ 345/99

FOREIGN PATENT DOCUMENTS

| EP | 0 749 236 A | 12/1996 |
|---|---|---|
| JP | 1-270470 | 10/1989 |
| JP | 2-124691 | 5/1990 |
| JP | 7-212616 | 8/1995 |
| JP | 8-22276 | 1/1996 |
| JP | 10-26953 | 1/1998 |

OTHER PUBLICATIONS

Patent Abstracts of Japan, Publication No. 05227029, date of publication Mar. 9, 1993.

* cited by examiner

Primary Examiner—Dennis-Doon Chow
(74) Attorney, Agent, or Firm—Wenderoth, Lind & Ponack, L.L.P.

(57) ABSTRACT

A phase control circuit sets the phase of a sampling clock signal for A/D conversion of a video signal in order. A binarizing circuit binarizes an analog video signal. A first counter circuit counts the changes of the output signal of the binarizing circuit. An A/D converting circuit digitizes the input signal. A second counter circuit counts the changes of the most significant bit of the A/D converting circuit. A subtracting circuit subtracts one from the other of the output signals of the two counter circuits. By changing the phase of the sampling clock signal of the A/D conversion in order within one period, the subtraction results are found, and this process is repeated for one or more periods. Thus the phase of the optimum sampling clock is set according to the subtraction results.

15 Claims, 12 Drawing Sheets

VIDEO SIGNAL PROCESSOR

TECHNICAL FIELD

The present invention relates to a video signal processing apparatus which converts an analog video signal to a digital signal.

BACKGROUND ART

Recently, a liquid crystal display device is mainly developed as a video apparatus to replace a cathode ray tube (CRT) display therewith. Video signals received from a personal computer by a display device such as a liquid crystal display (LCD) device are analog signals, and the signal level thereof changes in the unit of dot period. Therefore, a sampling clock signal matching to the dot period is needed for signal processing when the signal is written to a memory, when the signal is displayed on a matrix display device, and the like. However, most personal computers do not have an output terminal of such a sampling clock signal. Therefore, it is necessary to reproduce the sampling clock signal based on horizontal synchronization signal or the like received from a computer or the like. Further, the analog video signal cannot be obtained correctly if it is not sampled at a timing in a dot period when a stable signal is outputted. Therefore, the sampling timing has to be appropriate. Then, an appropriate timing of the sampling clock signal is set manually.

In a video apparatus, the sampling clock signal can be reproduced with a phase-locked loop (PLL) circuit by multiplying the input horizontal synchronization signal and by making both frequency and phase match to those of the input signal. However, the output signal of the PLL circuit has a phase delay because the timing signal required for display control is generated in a logic circuit at a later stage. Because this phase delay depends on the frequency of the input signal, it can not determined uniquely in a video apparatus which can receive various input signals. Therefore, scattering of the timing signal due to phase delay is a problem, especially on sampling.

In order to optimize the sampling point, a video information apparatus disclosed in Japanese Patent laid open Publication 9-149291 (1997) uses auto-correlation of video signals between frames. That is, a delay time of sampling clock signal is changed successively, and the auto-correlation between frames of video signals after analog-to-digital conversion is determined for each delay time. Then, a point having low correlation is adopted as a point at which the signal is changed. Then, by changing the sampling clock delay, an optimum sampling point is determined at a mid-point or thereabout of the signal-changing point. However, this conventional optimizing circuit needs a frame memory in order to determine the correlation value. Therefore, a complicated memory control circuit and high-speed clock signal are needed. A method using multiple A/D converter circuits is known as a method not using a memory. However, this method has a problem that a plurality of delay circuits for sampling clock are necessary.

An object of the invention is to provide a video signal processing apparatus which optimizes the sampling point when an analog video signal is converted to a digital signal.

DISCLOSURE OF THE INVENTION

A first video signal processing apparatus according to the present invention comprises:

a clock generator which generates a sampling clock signal for digitizing a video signal based on an input synchronization signal;

a phase controller which controls phase of the sampling clock signal at one of a plurality of phases in one period of the sampling clock signal;

a first signal generator which generates a first signal when the input video signal is larger than a threshold level;

a first counter which counts the first signal received from the first signal generator in a predetermined time;

a second signal generator which generates a second signal when the input video signal is larger than another threshold level, at a timing according to the sampling clock signal controlled by the phase controller;

a second counter which counts the second signal received from the second signal generator in the predetermined time; and a controller which makes the phase controller sequentially change the phase of the sampling clock signal in a period of the sampling clock signal, repeats the phase change over one or more periods of the sampling clock signal and sets the phase of the optimum sampling clock signal based on a difference between the output signals of the first and second counters obtained for each of the changed phases.

For example, the controller set the optimum phase of the sampling clock signal according to a plurality of the subtraction results obtained by the subtractor which performs subtraction between the output signals of the first and second counters. Thus, the phase of the sampling clock signal can be controlled by using a simple structure that the times of the cases when the video signal exceeds the threshold level is counted by the two counters. Further, timing control of the output signal of the binarizer circuit and that of an analog-to-digital converter are not needed. Further, high speed sampling clock signal is not needed to control the phase of the sampling clock signal, so that consumption power can be decreased. Further, because the sampling clock signal is not needed after the output of the binarizer circuit and the analog-to-digital converter, the counters can process a high speed signal. Therefore, this decreases consumption power and is advantageous for fabricating a large scale integrated circuit thereof.

In the video signal processing circuit, the optimum sampling clock timing can be set in various ways. For example, the controller sets a phase of the sampling clock signal, at which an absolute value of the count values of the first and second signals is equal to or smaller than a predetermined value, to the phase of optimum sampling clock signal. Alternatively, the controller sets a phase of the sampling clock signal, at which an absolute value of the count values of the first and second signals is equal to or smaller than a predetermined value and the absolute value is smallest, to phase of optimum sampling clock signal. Alternatively, the controller makes the phase controller change sequentially the phase of sampling clock signal in a period of the sampling clock signal, and when the controller continuously detects a phase of the sampling clock signal, at which an absolute value of count values of the first and second signals is equal to or smaller than a predetermined value, the controller sets a center value of the continuously detected phases of the sampling clock signal to the phase of optimum sampling clock signal. Alternatively, the controller makes the phase controller change sequentially the phase of sampling clock signal in a period of the sampling clock signal, and when the controller detects two or more phases of the sampling clock signal, at which an absolute value of count values of the first and second signals becomes maximum, the controller sets a center value of the two or more phases of the sampling clock signal to the phase of optimum sampling clock signal.

Further, in the video signal processing circuit, the controller preferably stops to control the phase controller when the output value of the first counter is equal to or smaller than a predetermined value. Thus, the phase control is stopped for video signal which does not change much, so that malfunction is prevented when the optimum sampling point is detected.

Further, in the video signal processing circuit, the controller preferably further comprises a threshold level controller which controls the threshold level of the first signal generator, and a comparator which compares the output signal of the second signal generator with a different threshold level. The controller decides whether the output value of the first counter is equal to or smaller than the predetermined level. Then, it decreases the threshold levels of the first signal generator and of the comparator when the output value of the first counter is equal to or smaller than the predetermined value. The output of the first counter is equal to or smaller than the predetermined value when the video signal has low level. Then, in such a case, the level for signal detection is decreased, so that the optimum sampling point can be detected even when the video signal has low level.

In a first video signal processing method according to the invention, a sampling clock signal is generated for digitizing a video signal based on an input synchronization signal, and phase of the sampling clock signal at one of a plurality of phases is changed sequentially in one period of the sampling clock signal. The phase setting is repeated over one or more periods of the sampling clock signal, and for each of the phase setting, a first signal is generated when the input video signal is larger than a threshold level and the first signal is counted in a predetermined time. Further, a second signal is generated when the input video signal is larger than another threshold level at a timing according to the sampling clock signal, and the second signal is counted in a predetermined time. Then, a phase of optimum sampling clock signal is set based on differences between the count values obtained by repeating the phase change.

In the video signal processing method, preferably, the phase control is stopped when the count value of the first signal is decided to be equal to or smaller than a predetermined value.

In the video signal processing method, preferably, when the count value of the first signal is decided to be equal to or smaller than a predetermined value, threshold levels for the first and second signals are decreased.

A second video signal processing apparatus according to the invention comprises:

a signal generator which binarizes an input video signal;

a clock generator which generates a sampling clock signal based on an input synchronization signal;

a phase controller which controls phase of the sampling clock signal at one of a plurality of phases in one period of the sampling clock signal;

a delay circuit which delays an output signal of the signal generator by one sampling period;

a maximum detector which receives the output signal of the signal generator and that of the delay circuit and performs subtraction of the two output signals to provide a maximum value of the absolute value of the subtraction; and a controller which makes the phase controller sequentially change the phase of sampling clock signal by the phase controller in a period of the sampling clock signal, repeats the phase setting over one or more periods of the sampling clock signal to decide the largest value in distribution of maximum values detected by the maximum detector and sets the phase of the largest value to an optimum sampling point. According to this invention, the sampling timing can be controlled by using a simple structure where subtraction results are obtained on video signal around one sampling, and distribution of absolute value of maximum value is detected. Further, by detecting the distribution of absolute value of maximum value, change in signal level can be detected, and correct sampling phase can be set.

In a second video signal processing method according to the invention, a sampling clock signal which digitizes a video signal is generated based on input synchronization signal, and phase of the sampling clock is changed sequentially at one of a plurality of phases in one period of the sampling clock signal. For each of the phase change, the input video signal is binarized, and the binarized signal is delayed by one sampling period, and the binarized signal. The delayed signal are received in a predetermined time and subtraction of the two output signals is performed to detect a maximum value of the absolute value of subtraction. Then, the largest value is decided in distribution of the detected maximum values, and the phase of the largest value is set to an optimum sampling point.

A third video signal processing apparatus according to the invention comprises:

a clock generator which generates a sampling clock signal based on an input synchronization signal;

a phase controller which controls phase of the sampling clock signal generated by the clock generator;

a signal generator which receives a video signal which changes alternately at a frequency of the sampling clock signal and binarizes the video signal at a timing of the sampling clock signal;

a two-phase processor which subjects an output signal of the signal generator to two-phase processing;

a plurality of level change detectors which detect the existence of level change for a plurality of output signals of the two-phase processor; and a controller which makes the phase controller change phase of the sampling clock sequentially and sets a phase, at which any of the level change detectors does not detect level change, to an optimum sampling point. Therefore, the sampling clock can be optimized at low speed processing.

In a third video signal processing method according to the invention, a sampling clock signal for digitizing a video signal is generated based on an input synchronization signal, and phase of the sampling clock signal is changed sequentially in a period of the sampling clock signal. The phase change is repeated over one or more periods of the sampling clock signal, wherein for each of phase change, a video signal which changes alternately at a frequency of the sampling clock signal is received, the video signal is binarized at a sampling timing of the sampling clock signal, the binarized signal is subjected to two-phase processing, and the level change is detected for a plurality of the output signals obtained in the two-phase processing. Then, a phase, at which the level change is not detected for any of the output signals, is set to an optimum sampling point.

This summary of the invention does not necessarily describe all necessary features so that the invention may also be a sub-combination of these described features.

BEST MODE FOR CARRYING OUT THE INVENTION

Figure 1:
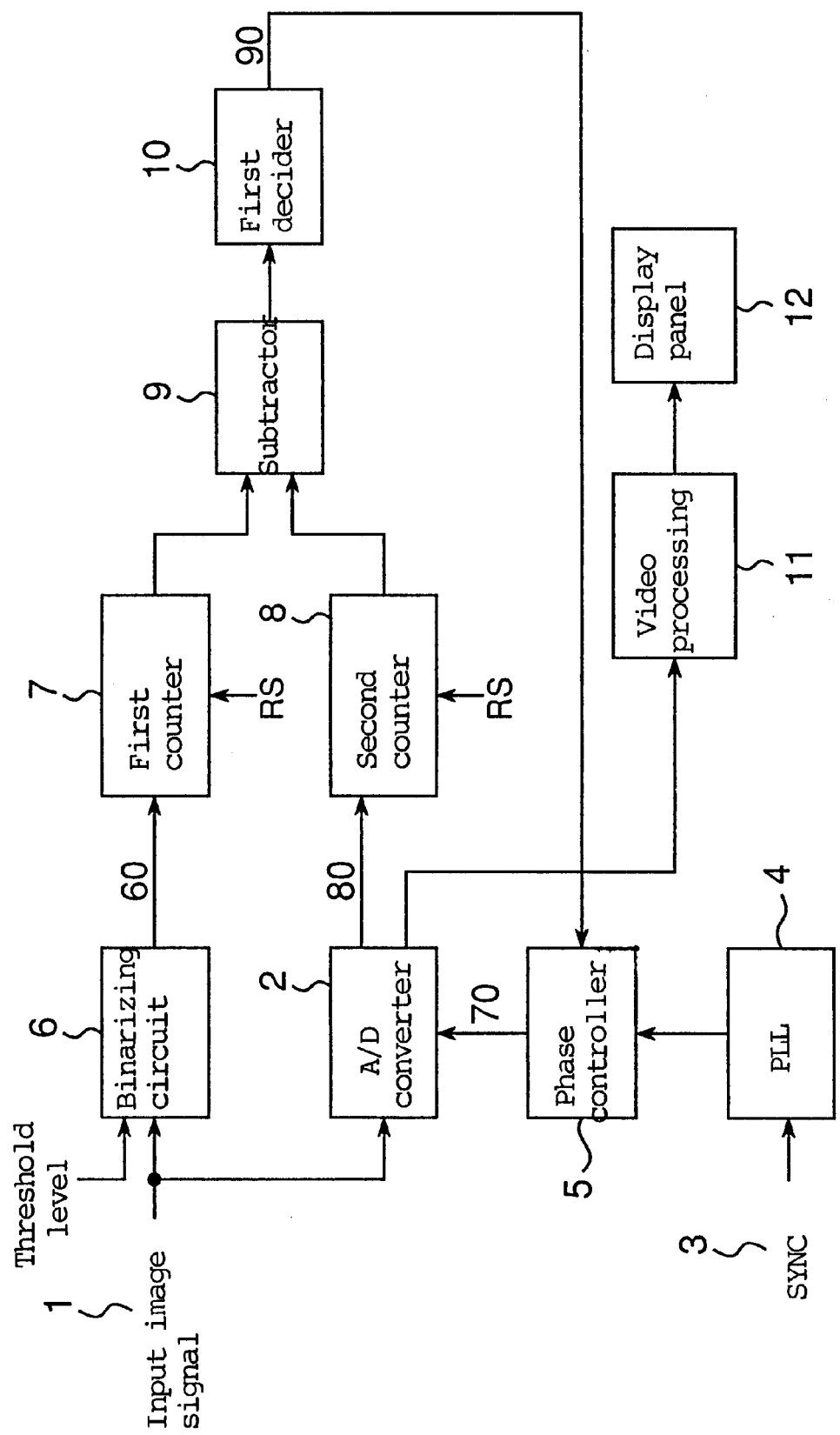
FIG. 1 is a block diagram of a video signal processing apparatus according to a first embodiment of the present invention.

Embodiments of a video signal processing apparatus according to the present invention are described in detail below with reference to the appended drawings, wherein like reference characters designate like or corresponding parts throughout the several views.

FIG. 1 shows a video signal processing apparatus according to a first embodiment of the present invention. The video signal processing apparatus is for example a liquid crystal display device. In the video signal processing apparatus of the embodiment, an input analog video signal is compared with a threshold level by a binarizing circuit 6 and an analog-to-digital (A/D) converter circuit 2, and two counters 7, 8 count times when a video signal is changed over the threshold level, in a predetermined time. The A/D converter 2 performs the conversion at a controlled phase of sampling clock signal. Thus, the binarizing circuit 6 and the A/D converter 2 perform the comparison with the threshold level at different timings. When the phase of sampling clock signal is appropriate, there is no difference between the two counts, but when the phase is not appropriate, the difference between the two counts becomes large. Then, as to the sampling clock signal, a plurality of phases (for example, four phases) or sampling timing can be selected sequentially in one period of sampling clock signal. Then, a phase controller circuit 5 selects the phase sequentially in one period, and the above-mentioned two counts are determined for each of the selectable phases (sampling timings) in a predetermined time (equal to or longer than one period). Then, differences between the counts obtained for each of the selectable phases are compared, and the phase at which the difference becomes smaller than a predetermined value is set to an optimum phase for processing video signals.

Figure 2:
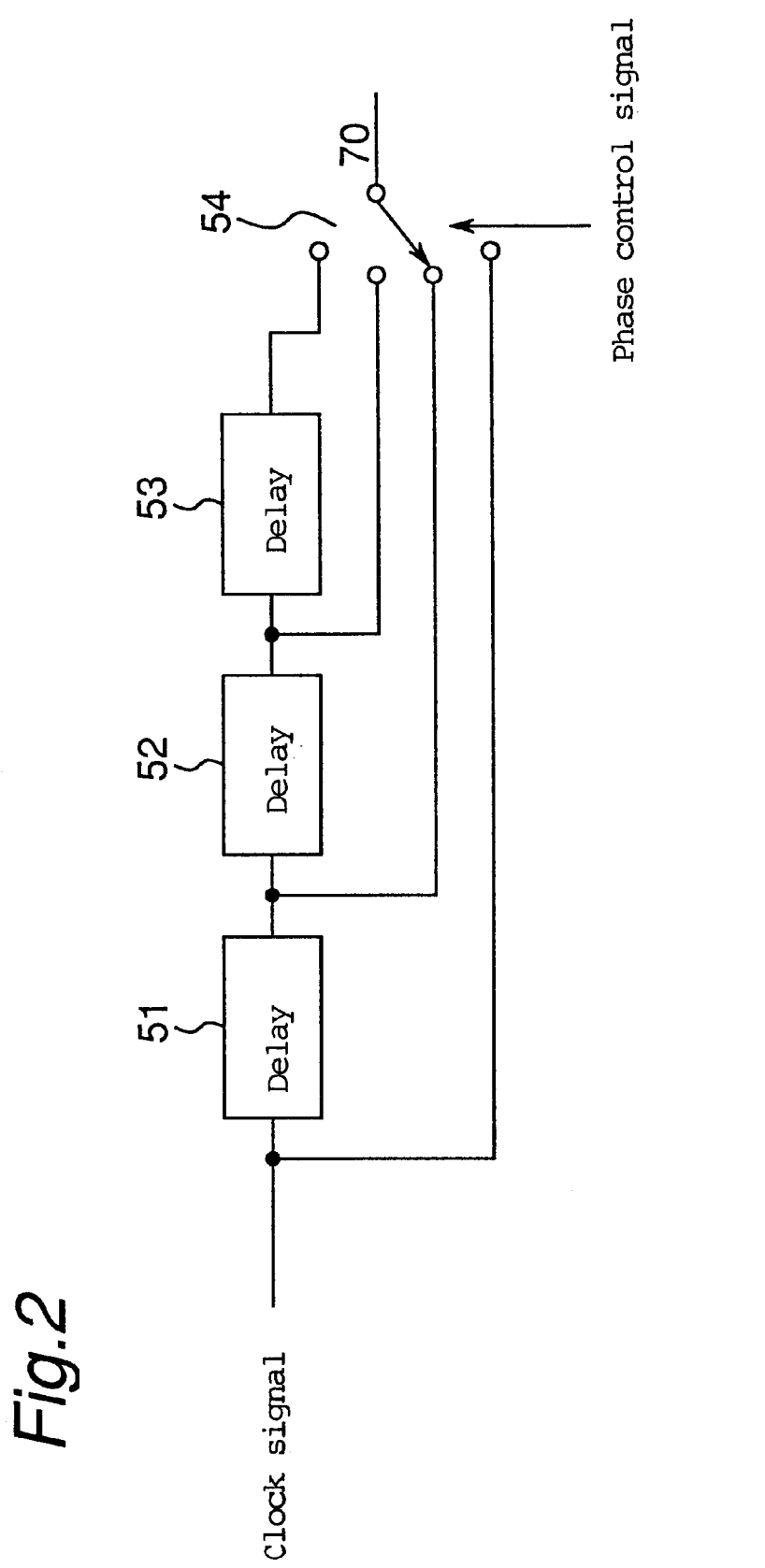
FIG. 2 is a circuit diagram of a phase controller circuit.

This is further explained in detail with reference to FIG. 1. An input video signal 1 is supplied to the A/D converter 2. On the other hand, a sampling clock signal 70 is generated based on a synchronization signal (for example a horizontal synchronization signal) 3 by the phase-locked logic (PLL) circuit 4 and the phase controller 5. The PLL circuit 4 generates a sampling clock signal based on the synchronization signal. As shown in FIG. 2, the phase controller 5 comprises three delay elements 51, 52 and 53 connected in series and a selector 54. By controlling the selector 54 according to a phase control signal 90, four signals of different phases can be outputted in one period of sampling clock signal. That is, the phase controller 5 outputs a clock signal of a phase in correspondence to the phase control signal 90 to the A/D converter 2. The A/D converter 2 samples the input video signal 1 at the sampling clock timing due to the clock signal, and outputs an 8-bit digital signal to an image processing circuit 11. The video processing circuit 11 performs enlargement, reduction or the like and displays the obtained video data on a liquid crystal display panel 12.

Figure 4:
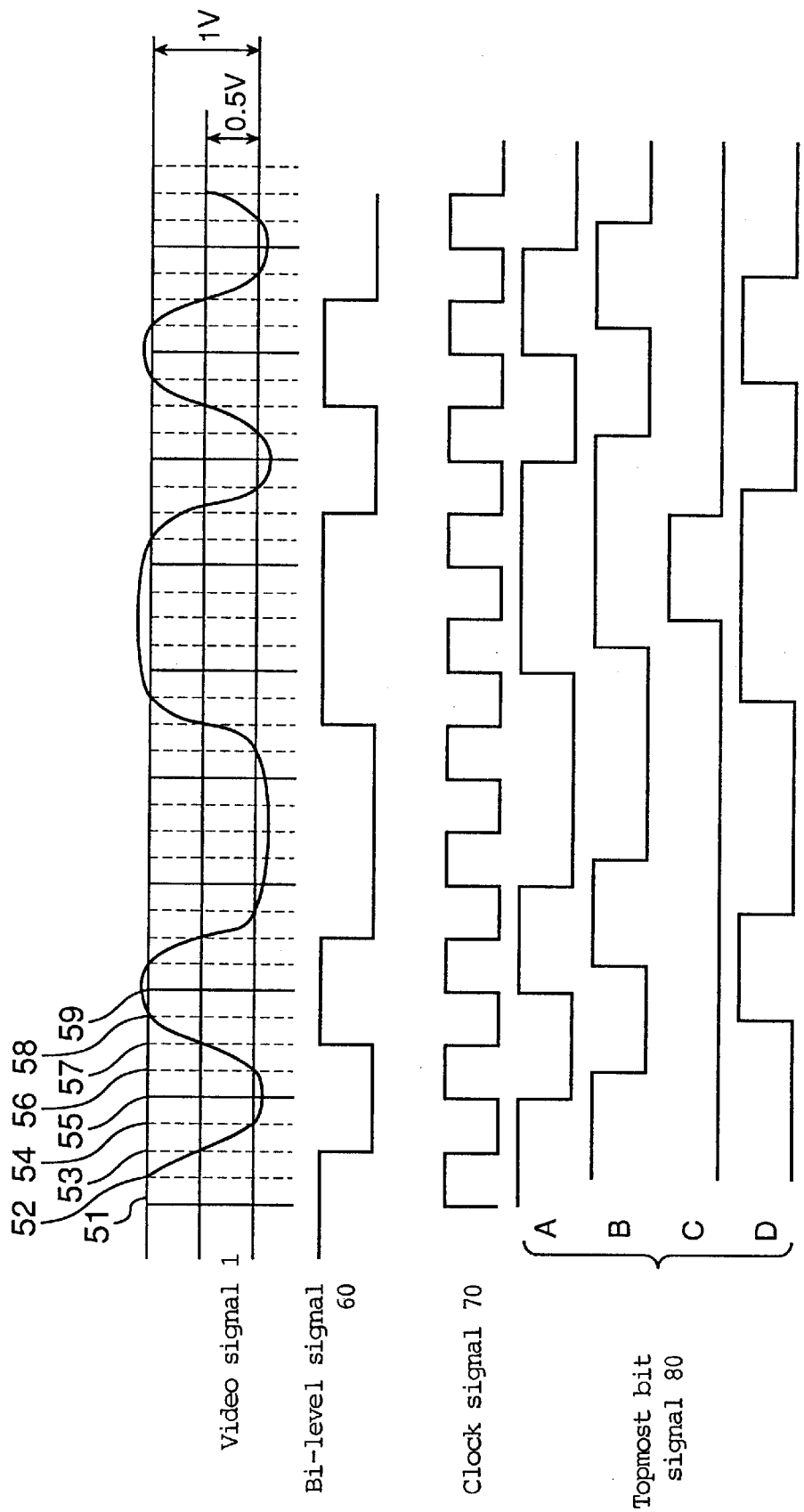
FIG. 4 is a waveform diagram of the video signal processing apparatus according to the first embodiment of the present invention.

Further, the input image signal 1 is also supplied to the binarizing circuit 6 comprising a comparator. The binarizing circuit 6 compares it with a predetermined level to binarize the input image signal 1, and a bi-level output signal 60 is supplied to the first counter 7. (For example as shown in FIG. 4, the predetermined level is set to 0.5 V for video signal of 1 V.) Further, the topmost bit signal 80 from the A/D converter 2 is supplied to the second counter 8. The first and second counters 7, 8 count input signals in a predetermined time (for example, one vertical period or a plurality of horizontal periods) and supply the results to a subtractor circuit 9. The topmost bit from the A/D converter 2 is binarized with the same level of threshold level as the binarizing circuit 6. Therefore, the first and second counters 7, 8 perform binarization with the same threshold level eventually to count the change in video signal. (However, the threshold level is not necessarily the same.) The subtractor 9 performs subtraction of the count values from the first and second counters 7, 8 and supplies the absolute value of the difference of the two count values to a first decider circuit 10. The first decider circuit 10 sequentially changes the phase to be set by the phase controller 5 in a period and determines at each different phase whether the absolute value supplied from the subtractor 9 is within a predetermined range. The phase at which the absolute value is within this range is set to the optimum sampling phase.

Figure 3:
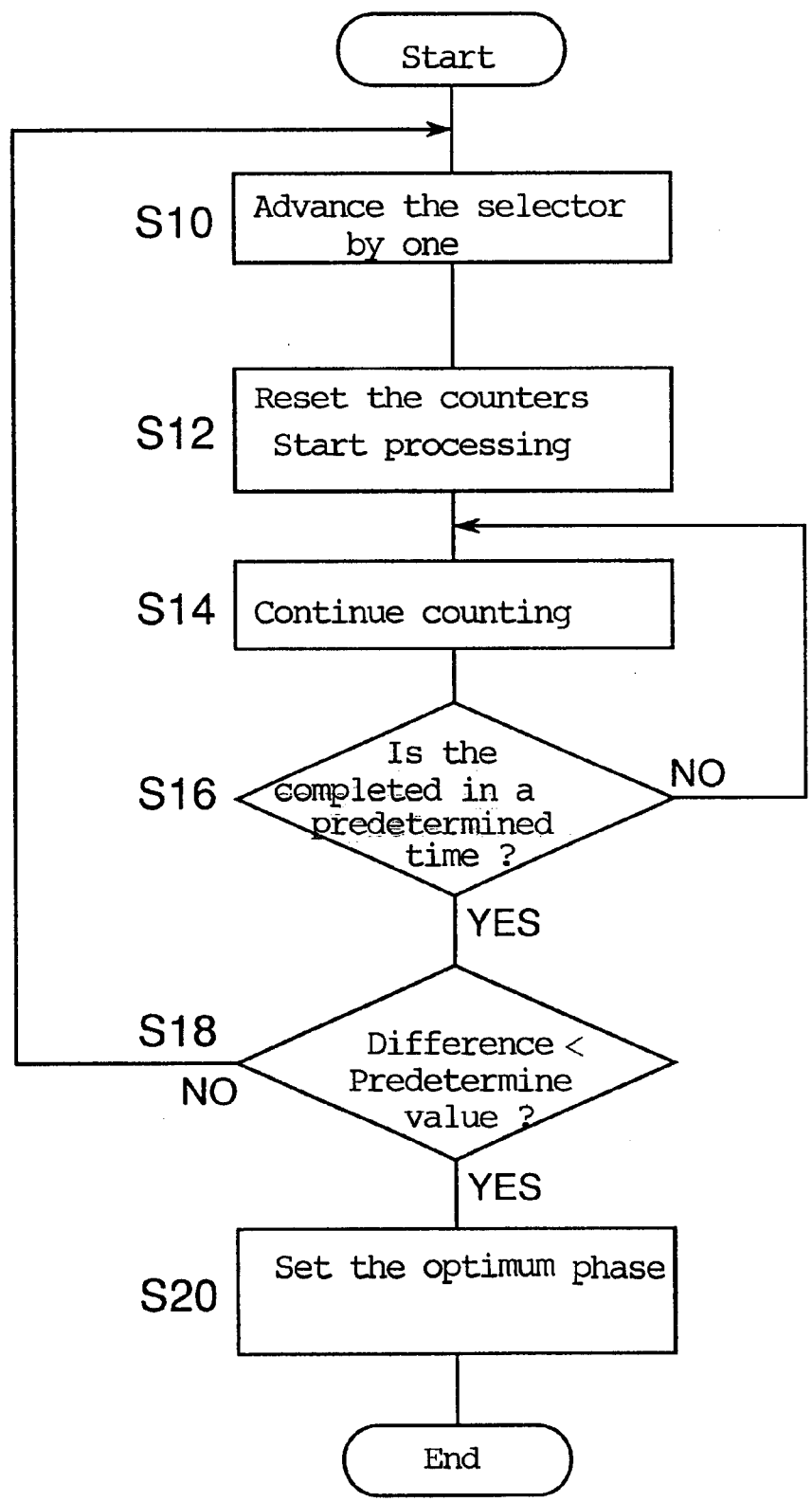
FIG. 3 is a flowchart of control of a first decision circuit.

The first decider circuit has a central processing unit (CPU). As explained above, it sends a phase control signal 90 to the phase controller 5 to control the phase of sampling clock and to set the optimum sampling clock for the second counter 8. FIG. 3 shows a flow of sampling optimization by the CPU. First, the phase control signal 90 is sent to the phase controller 5 to advance the selector 54 by one (step S10), to set a sampling phase in a period of sampling clock signal. Next, the count values in the first and second counters 7, 8 are reset (step S12). Then, the two counters 7, 8 continue counting (step S14). The counting at step S14 is repeated until a predetermined time elapses (step S16). When the predetermined time elapses, it is decided whether the absolute values of the difference of the counts from the subtractor 9 is smaller than a predetermined value or not (step S18). If the absolute value of the difference of the counts from the subtractor 9 is equal to or larger than the predetermined value, the sampling phase is an anomalous one. Then, the flow returns to step S10, and the phase is reset to a next one to repeat the above processing. If the absolute value of the difference of the counts from the subtractor 9 is smaller than the predetermined value, the sampling phase is decided to be an optimum one (step S20). Thus, the optimum phase of the sampling clock signal is set.

FIG. 4 shows waveforms of signals in the video signal processing apparatus. With reference to the waveforms, operation is explained when the sampling phase is appropriate and when it is inappropriate. In the video signals shown in FIG. 4, vertical solid line represents basic phase, while dashed lines represent three phases obtained by delay.

The sampling phase is controlled at four values in one period of sampling clock by the phase controller 5. The phase of the phase controller 5 is changed sequentially in one period of the sampling clock, and this is repeated over one or more periods of sampling clock. In correspondence to the four phases, the topmost bit outputted by the A/D converter 2 which digitized the video signal is changed, as shown in FIG. 4 as A, B, C and D. In case of A, sampling is performed at sampling points 51, 55 and the like. Similarly, in case of B, sampling is performed at sampling points 52, 56 and the like, in case of C, sampling is performed at sampling points 53, 57 and the like, and in case of D, sampling is performed at sampling points 54, 58 and the like. In the case of C, the output signal 80 of the A/D converter 2 becomes most unstable because sampling is performed at a changing portion in the input signal. Therefore, as will be understood by comparing the bi-level signal 60 with the topmost bit 80, the output data of the first counter 7 is different largely from that of the second counter 8, and the subtraction result or difference of a large value is supplied to the first decider 10. The first decider 10 decides that a sampling point at which the absolute value of the output value of the subtractor 9 is equal to or larger than the predetermined value is a bad sampling point. In the case of C, the sampling phase is inappropriate. The phase controller 5 controls the phase at a plurality of sampling points, and the optimum sampling point is decided by the first decider 10 based on the plurality of subtraction results. In the example shown in FIG. 4, the value of subtraction result is large for C and small for A, B and D. By setting an appropriate value, a phase at least satisfying that the absolute value of the subtraction result is smaller than the predetermined value is selected as the optimum sampling phase.

The optimum sampling phase can be selected in various ways. For example, when there are a plurality of cases where the absolute values of the subtraction result is equal to or smaller than the predetermined value, a phase in correspondence to the smallest value among them may be adopted.

Alternatively, when there are a plurality of cases where the absolute value of the subtraction result is equal to or smaller than the predetermined value, a center thereof may be set to the optimum sampling phase. Thus, the sampling point can be set more stably.

As mentioned above, the phase of the phase controller 5 is changed sequentially in one period of sampling clock, and this is repeated over one or more periods. When two or more phases are found to have the maximum subtraction result (for example, phase 53 in FIG. 4), the center thereof may be set to the optimum phase.

By controlling the phase of sampling clock signal sequentially to detect the largest and the smallest in one period of sampling clock signal, the set value for the first decider 10 may be determined as the difference between the largest and smallest values multiplied with a predetermined factor.

Further, the difference between the two count values may be detected generally with a different calculation technique, without using the subtractor.

In the above-mentioned video signal processing apparatus, the optimum phase can be set with a low-cost circuit structure because the binarized signals are used. Further, it is not necessary to adjust the output signal of the binarizing circuit with a digital circuit following the A/D converter. Further, because the number of level change is detected, a PLL circuit does not need to output a high-speed sampling clock, and low power consumption can be achieved. The adjustment of the sampling timing becomes important as the frequency of video signal is increased, while the video signal processing apparatus can optimize the sampling point even when the frequency becomes higher.

Figure 5:
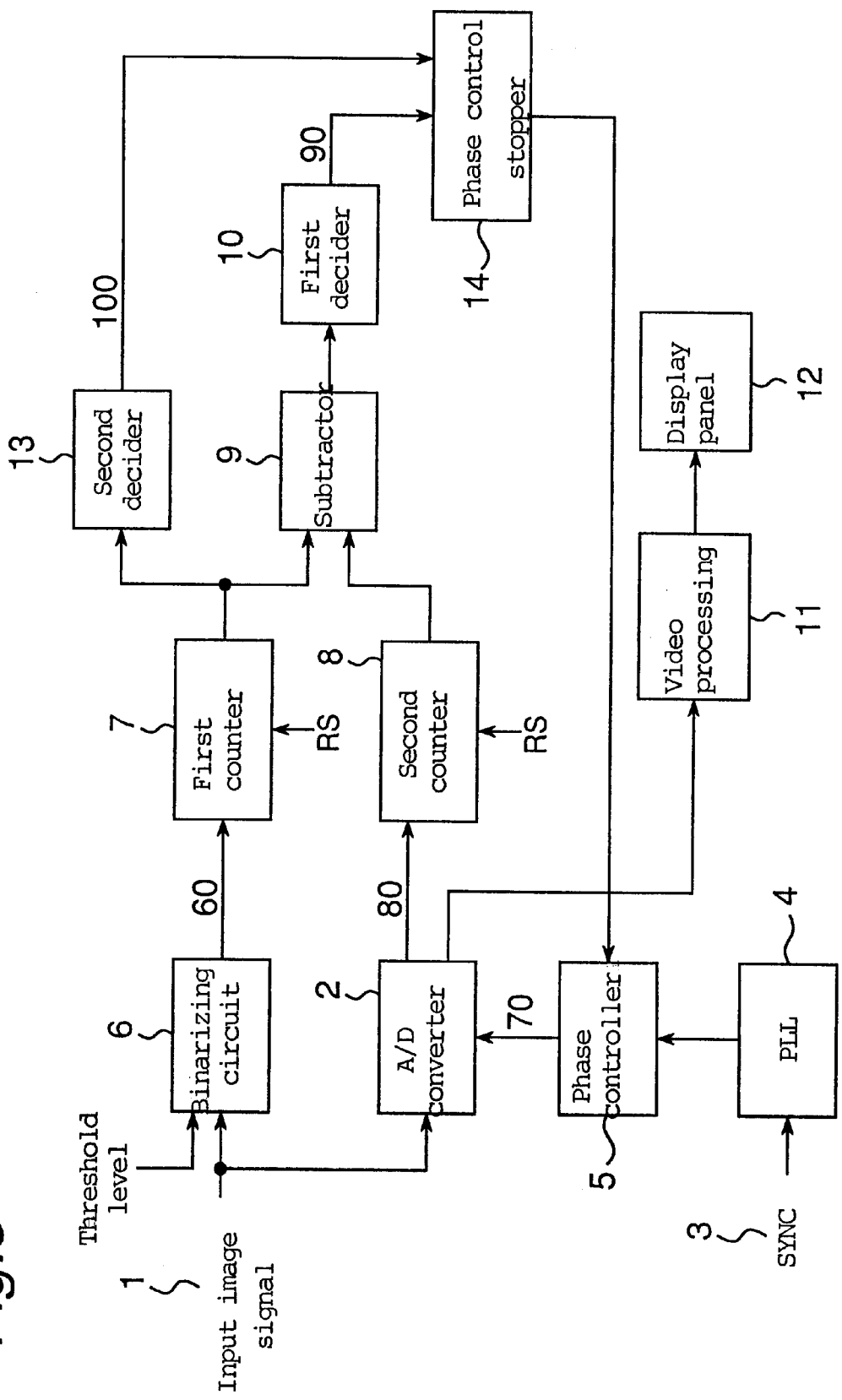
FIG. 5 is a block diagram of a video signal processing apparatus according to a second embodiment of the present invention.

FIG. 5 shows a structure of a video signal processing apparatus according to a second embodiment of the present invention. In the video signal processing apparatus according to the first embodiment shown in FIG. 1, the detection of the optimum sampling point may be operated erroneously for video information which does not change much. Then, in the video signal processing apparatus according to this embodiment, the above-mentioned optimum phase setting of sampling clock is not performed for video information which does not change much.

As shown in FIG. 5, a second decider 13 and a phase control stopper circuit 14 are provided further. The second decider 13 has a comparator, which compares the count value outputted by the first counter 8 with a predetermined value. When the count value is equal to or smaller than the predetermined value, a phase control stop signal 100 is sent to the phase control stopper circuit-14 in order to stop to output the phase control signal 90. The phase control stopper circuit 14 has a switch which passes the phase control signal 90, and the switch is controlled by the phase control stop signal 100.

The operation is explained further. For ordinary video signals, the phase control stopper circuit 14 does not receive the phase control stop signal 100 because the count value outputted by the first counter 8 is equal to or larger than the predetermined value. In this case, the phase control stopper circuit 14 sends the phase control signal 90 as received from the first decider 10 to the phase controller 5. Then, the phase controller 5 controls the phase sequentially according to the phase control signal 90 and sets the optimum sampling phase.

On the contrary, when the count value outputted by the first counter 8 is found to be smaller than the predetermined value, the phase control stopper circuit 14 receives the phase control stop signal 100 from the second decider 13. Then, the phase control stopper circuit 14 stops to output the phase control signal 90 received from the first decider 10. When the count value outputted by the first counter 8 is equal to or smaller than the predetermined value, this means that the video signal does not change much. In such a case, in order to avoid malfunction in the detection of optimum sampling point, the optimization of sampling timing is not performed. Thus, the phase control is stopped by the phase control stopper circuit 14 when the output signal of the first counter 8 is equal to or smaller than the predetermined value. Then, malfunction of the detection of optimum sampling point is prevented for video signal which does not change much.

Figure 6:
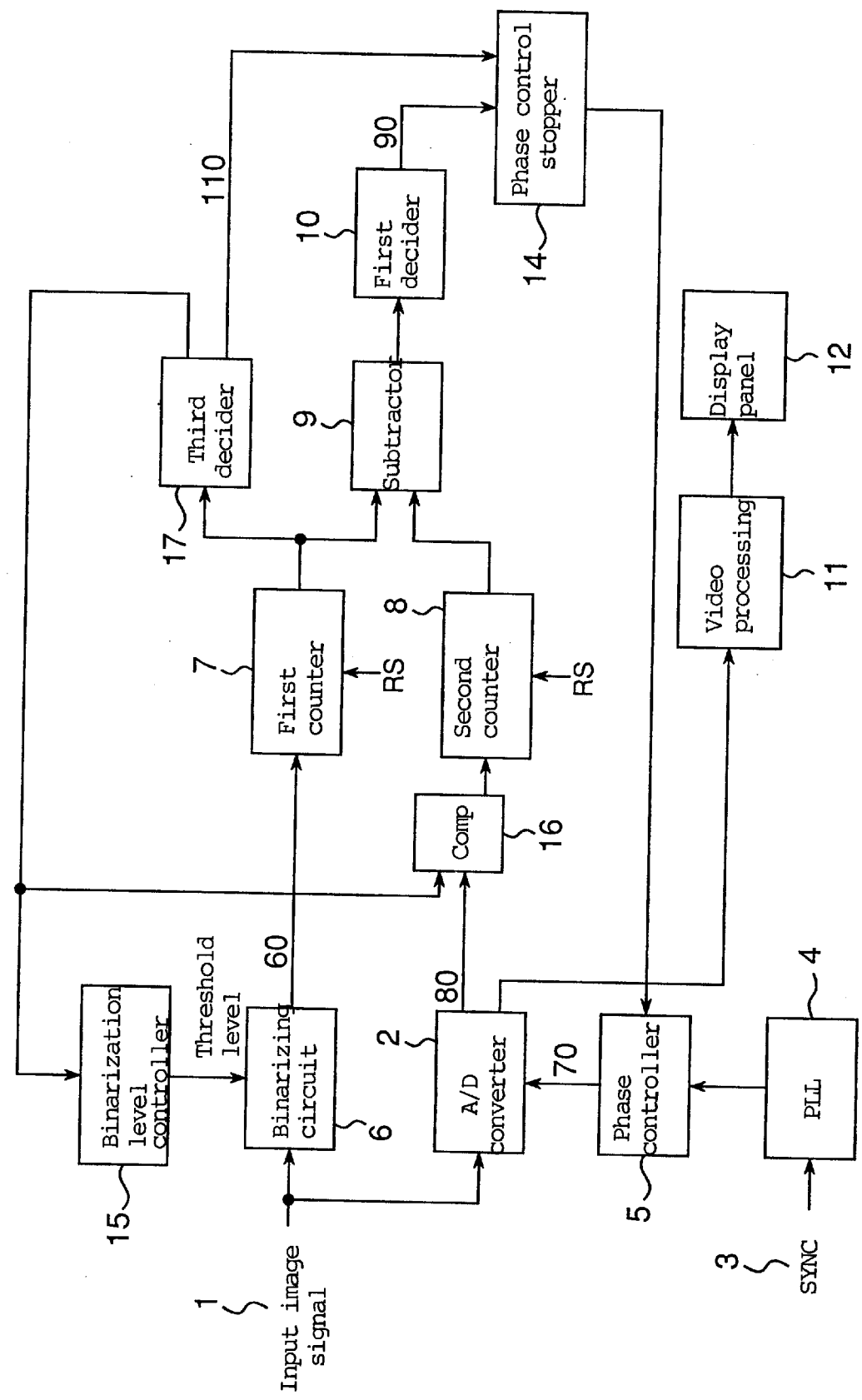
FIG. 6 is a block diagram of a video signal processing apparatus according to a third embodiment of the present invention.

FIG. 6 is a block diagram of a video signal processing apparatus according to a third embodiment of the present invention. In the video signal processing apparatus, the optimum sampling point is detected even when the video signal has a small level. A third decider circuit 17 is provided to decrease the threshold level of the binarizing circuit and that for the digital value outputted by the A/D converter to detect the optimum sampling point.

The video signal processing apparatus has a binarization level controller circuit 15, a comparator 16 and a third decider circuit 17. The binarization level controller circuit 15 converts the threshold level from the third decider circuit 17 to an analog level and outputs it to a threshold level of the binarization circuit 6. Further, the comparator 16 compares the output signal of the A/D converter 2 with the threshold level from the third decider 17. The third decider 17 has a CPU and detects the optimum sampling point even when the video signal has a small level, by setting a small threshold level for binarization in the binarization circuit 6 and the comparator 16. Further, when the video information has a small level (or when video information equal to or larger than a predetermined value is not detected), the third decider 17 outputs a phase control stop signal 110 to the phase control stopper circuit 14 to stop the adjustment of the optimum sampling point. In this case, it is informed to an operator with a video image, an audio signal, a light-emitting diode or the like. The phase control stopper circuit 14 has a switch to pass the phase control signal 90, and the switch is controlled with the phase control stop signal 110. Thus, an optimum sampling point can be set, similarly to the video signal processing apparatus of the first embodiment.

Figure 7:
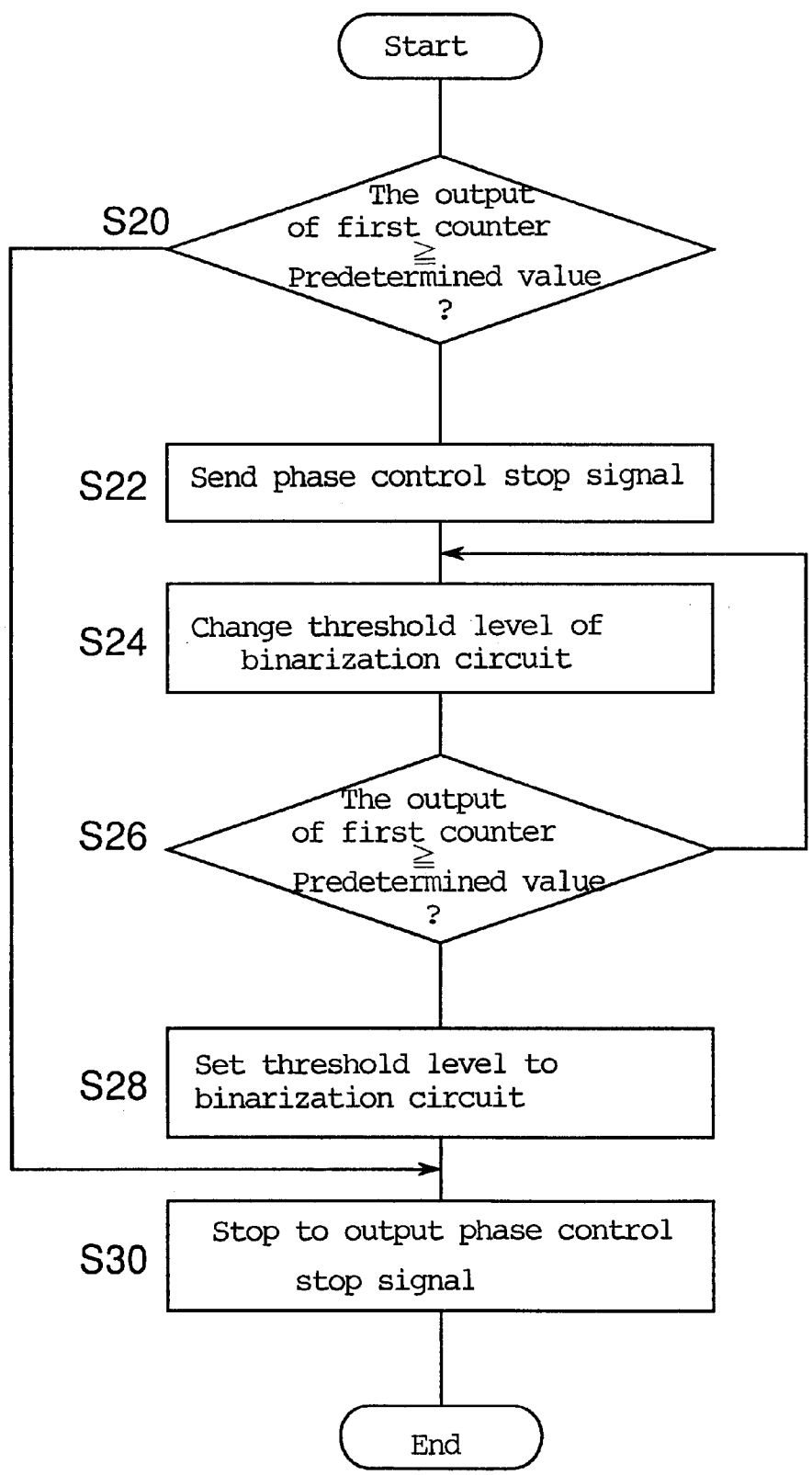
FIG. 7 is a flowchart of control of a first decision circuit.

FIG. 7 shows a flow of control by the CPU of the third decider 17. First, a count value output from the first counter 8 is compared with a predetermined value (step S20). If the value outputted by the first counter 8 is equal to or larger than the predetermined value, the phase control stop signal 110 is not outputted (step S30). Then, the phase control stopper circuit 14 sends the as-received phase control signal 90 from the first decider 10 to the phase controller 5, and the phase controller 5 controls the phase sequentially with the phase control signal 90 and sets the optimum sampling phase. This is the control for ordinary video signal.

On the contrary, if the value outputted by the first counter 8 is smaller than the predetermined value, the phase control stop signal 110 is sent to the phase control stopper circuit 14 (step S22). Then, the phase control stopper circuit 14 stops to output the phase control signal 90 received from the first decider 10 to the phase controller 5. Further, the third decider 17 decreases the threshold level (analog value) for binarization in the binarization level controller 15 (step S24), and it is decided again whether the output value from the first counter 8 is equal to or larger than the threshold value or not (step S26). If it is decided that the output value from the first counter 8 is smaller than the threshold value even after the threshold value is set lower, the flow returns to step S24 to change the threshold value again. If the value outputted by the first counter 8 is decided equal to or larger than the predetermined value, the threshold level is supplied to the comparator 16 (step S28). Then, the digital output signal from the A/D converter 2 is compared with the same threshold level as the binarization circuit 6, to give a bi-level value. Next, A the phase control stop signal 110 is stopped to be supplied to the phase control stopper circuit 14 (step S30), and the control of the optimum sampling point is performed. That is, the phase control stopper 14 sends the phase control signal 90 to the phase control circuit 5 to adjust the optimum sampling point. Thus, when the count value of the first counter 8 is equal to or smaller than the predetermined value, the third decider 17 changes the threshold level of the binarization in the binarization circuit 6 and that in the comparator 16, so that the optimum sampling point can be detected even when the video information is small.

Next, a video signal processing apparatus according to a fourth embodiment of the present invention is explained. In the video signal processing apparatus, the subtraction result of video signals around a sampling timing is determined by changing the phase. The largest in the absolute values of the subtraction results corresponds to a phase at which the change in signal level is largest. Then, the phase in correspondence to the largest value in the distribution of the absolute values of the maximum values is set to the optimum sampling point.

Figure 8:
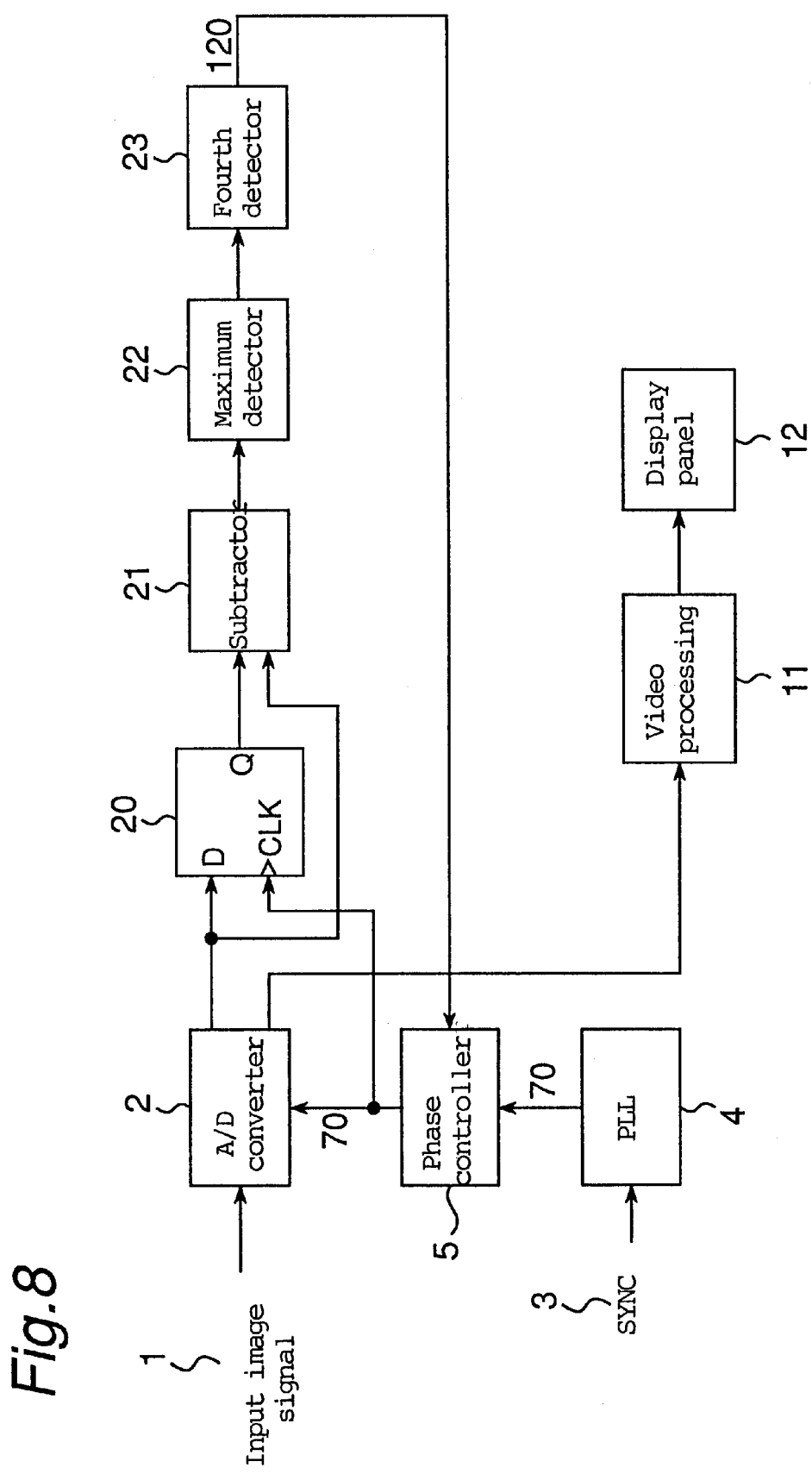
FIG. 8 is a block diagram of a video signal processing apparatus according to a fourth embodiment of the present invention.

FIG. 8 is a block diagram of the video signal processing apparatus of the fourth embodiment. The phase controller 5 controls the phase of the sampling clock signal from the PLL circuit 4 and supplies it to the A/D converter 2 and to a delay circuit 20. The A/D converter 2 digitizes the input video signal 1. The delay circuit 20 has a delay flip-flop (D-FF) operated with the sampling clock signal, and it delays the topmost bit of the output signal of the A/D converter 2 by one sampling clock period. A subtractor 21 receives output signals from the A/D converter 2 and from the delay circuit 20 and performs subtraction between them to send the result to a maximum detector circuit 22. The maximum detector 22 detects a maximum in the absolute values of the subtraction value around one sampling and sends it to a fourth decider 23. The fourth decider 23 sends a phase control signal to the phase controller 5 to control the phase of the sampling clock signal sequentially and to decide a phase at the largest among the maximum values detected by the maximum detector 22. Then the largest value is set to the optimum sampling point for the phase controller 15. Thus, by using a simple circuit structure where the maximum value of the subtraction value of video signal around one sampling is detected, the optimum sampling point can be detected. By detecting distribution of the maximum values, change in signal level can be detected, and a correct sampling phase is set. It can also be detected simultaneously that the video signal is made of constant level such as all white, and malfunction can be prevented.

Figure 9:
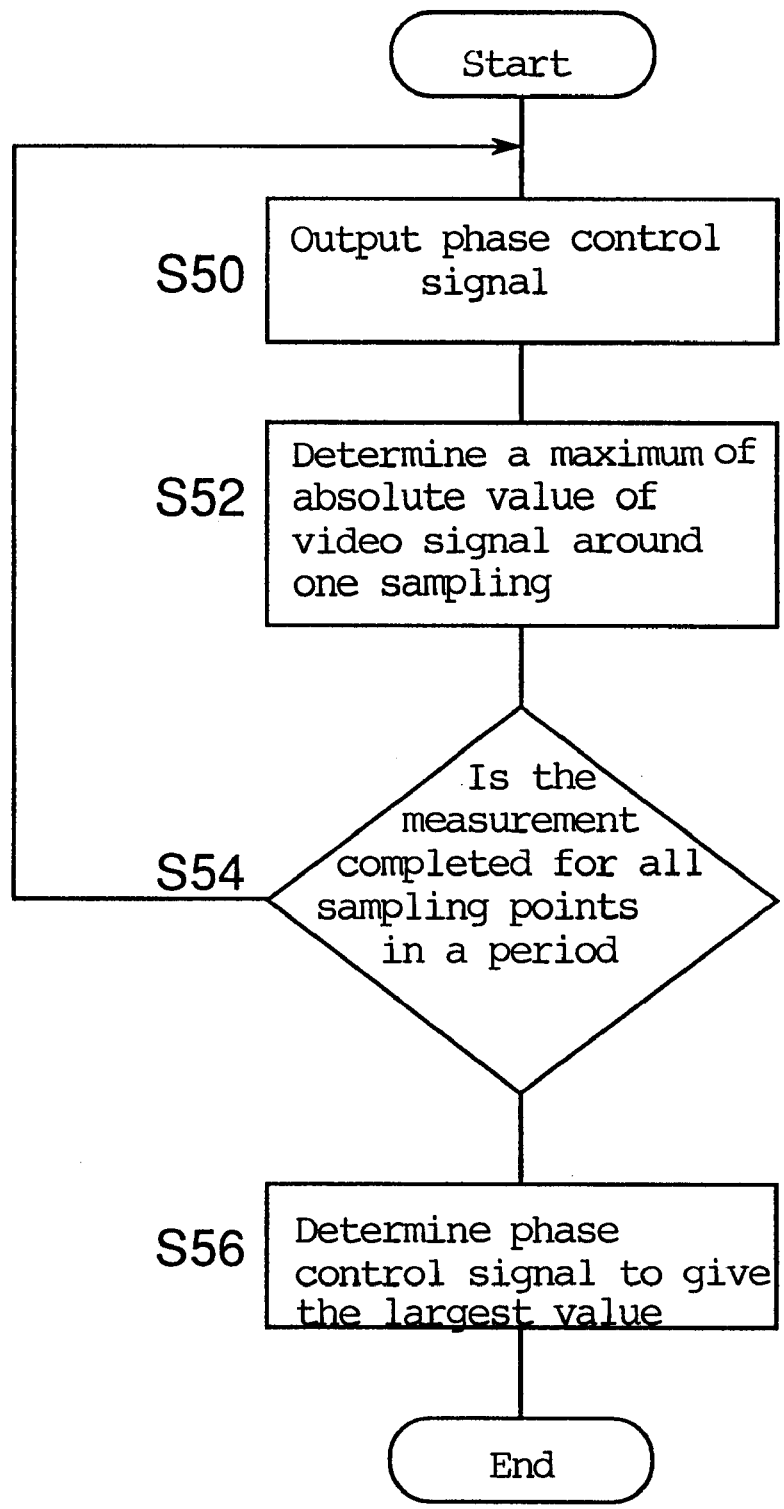
FIG. 9 is a flowchart of control of a fourth decision circuit.

FIG. 9 shows a flow of control of a CPU in the fourth decider 22. First, the phase control signal 90 is sent to the phase controller 5 to set a first sampling phase in one period of sampling clock signal (step S50). Next, a maximum of the absolute value of the difference of video signals around one sampling is determined (step S52). Next, it is checked whether the measurement is completed on all the sampling phases which can be set in one period (step S54). If it is checked that the measurement is not completed, the flow returns to step S50, to set the phase control signal for a next sampling phase and the absolute value of the difference is received. If it is checked that the measurement is completed on all the sampling phases, the phase control signal is determined for the phase to result in the largest in the maximum values of the absolute value of the difference is determined in the phases in one period (step S56).

Figure 10:
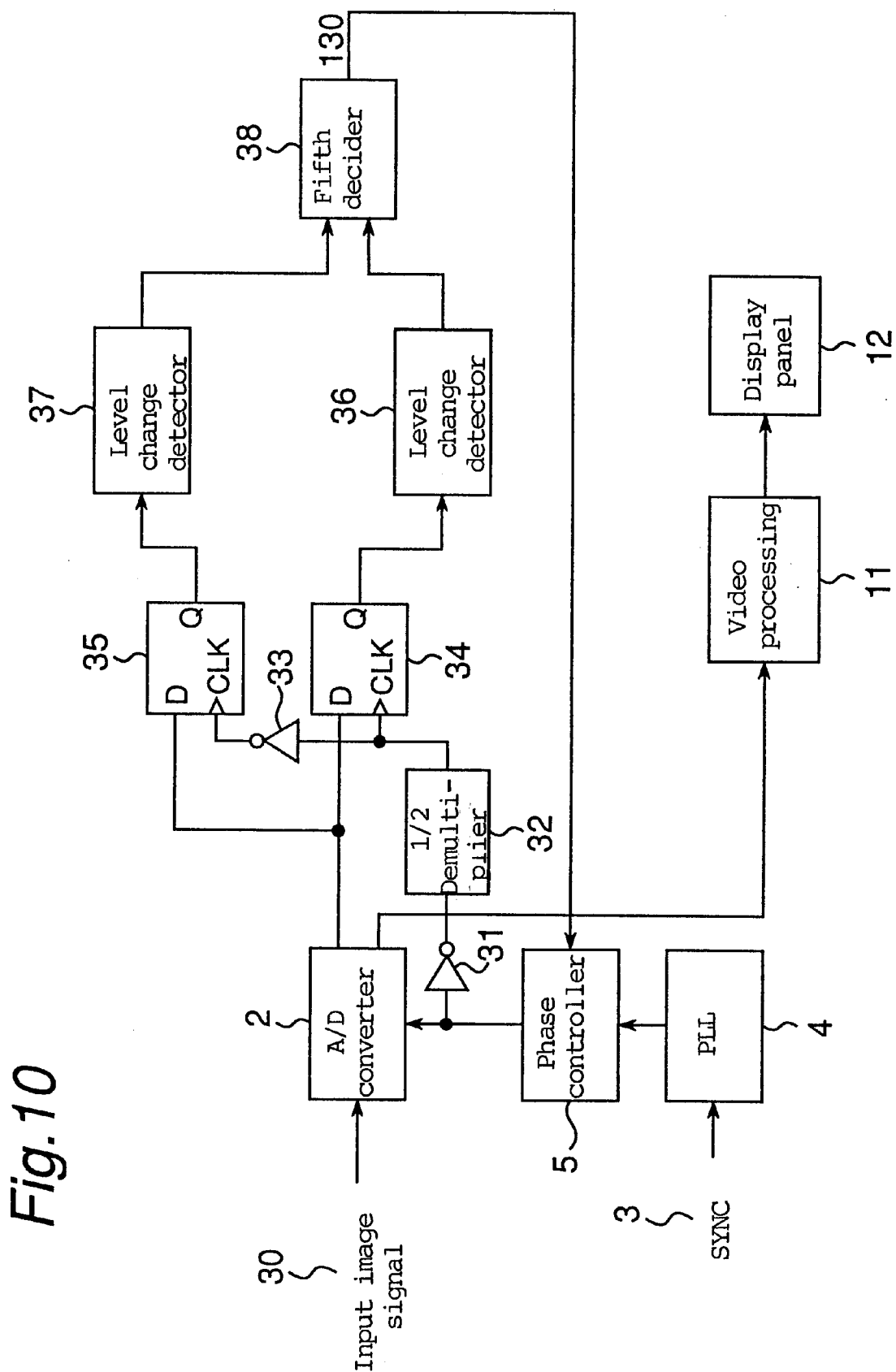
FIG. 10 is a block diagram of a video signal processing apparatus according to a fifth embodiment of the present invention.
Figure 11:
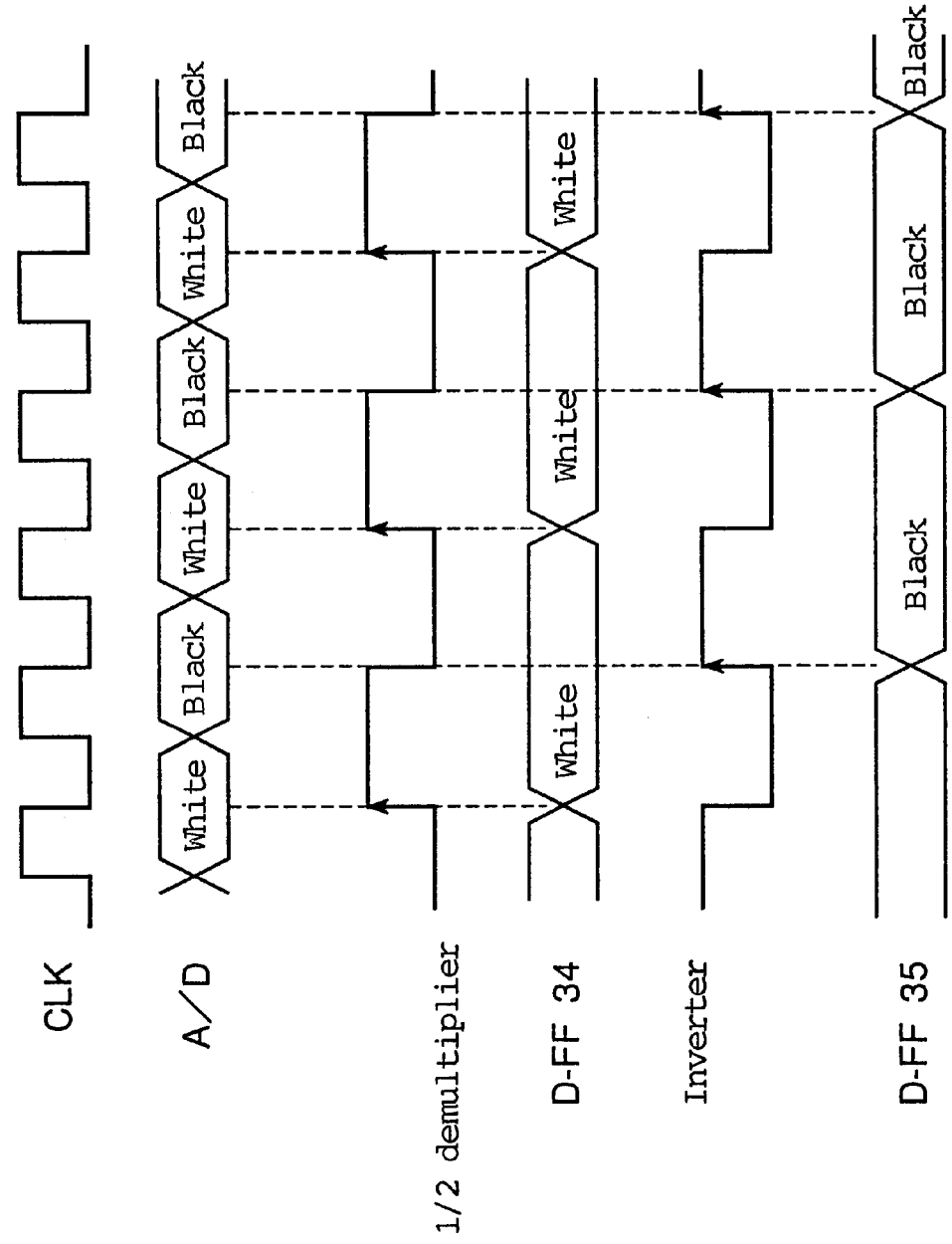
FIG. 11 is a timing chart of two-phase processing.

Next, a video signal processing apparatus in a fifth embodiment of the invention is explained. As shown in FIG. 10, in the video signal processing apparatus, the optimum sampling timing is adjusted by using a particular video signal 30 which changes alternately at the period of sampling frequency. The phase controller 5 adjusts the phase of sampling clock signal generated by the PLL circuit 4. The A/D converter 2 digitizes the particular video signal 30. Next, one or a plurality of bits in the output signal of the A/D converter 2 is processed in two lines by a two-phase processor circuit. In the two-phase processor circuit, the signal from the A/D converter 2 is sent to delay flip-flops (D-FF) 34, 35 in the two lines. Further, inverters 31, 33 and a ½ frequency demultiplier 32 generates a clock signal of a frequency halved on the sampling clock signal and an inverted clock signal, which are supplied to the delay flip-flops (D-FF) 34 and 35, respectively, as clock signals. A timing chart shown in FIG. 11 shows output signals of each circuit. For example, if the input signal (an output signal of A/D converter) is changed at the sampling period alternately between white and black, output signals of the two lines subjected to the two-phase processing (outputs of the delayed flip-flops 35, 34) are necessarily at constant levels (white, white, white, . . . , or black, black, . . . ) as far as the sampling timing is appropriate, or the level change is observed. Level change detectors 36 and 37 detect change in output signal of the delay flip flop 34, 35, and the detection result of level change is supplied to a fifth decider circuit 38. For example, when level change occurs, status signal of "1" is sent to the fifth decider 38. In this case, the fifth decider 38 decides that the sampling point is bad and sets the phase control for the phase controller 5. On the contrary, when no level change occurs, the optimum sampling point is decided to be set, and the phase where no level change occurs is set to the optimum sampling point. Thus, the optimum sampling point can be detected with a simple two-phase processing by receiving the particular video signal. Further, the level change can be detected with a low speed processing, and this is advantageous for fabricating the processing circuit in an integrated circuit. The two-phase processing circuit maybe realized in various circuit structures besides the example shown in FIG. 10.

Figure 12:
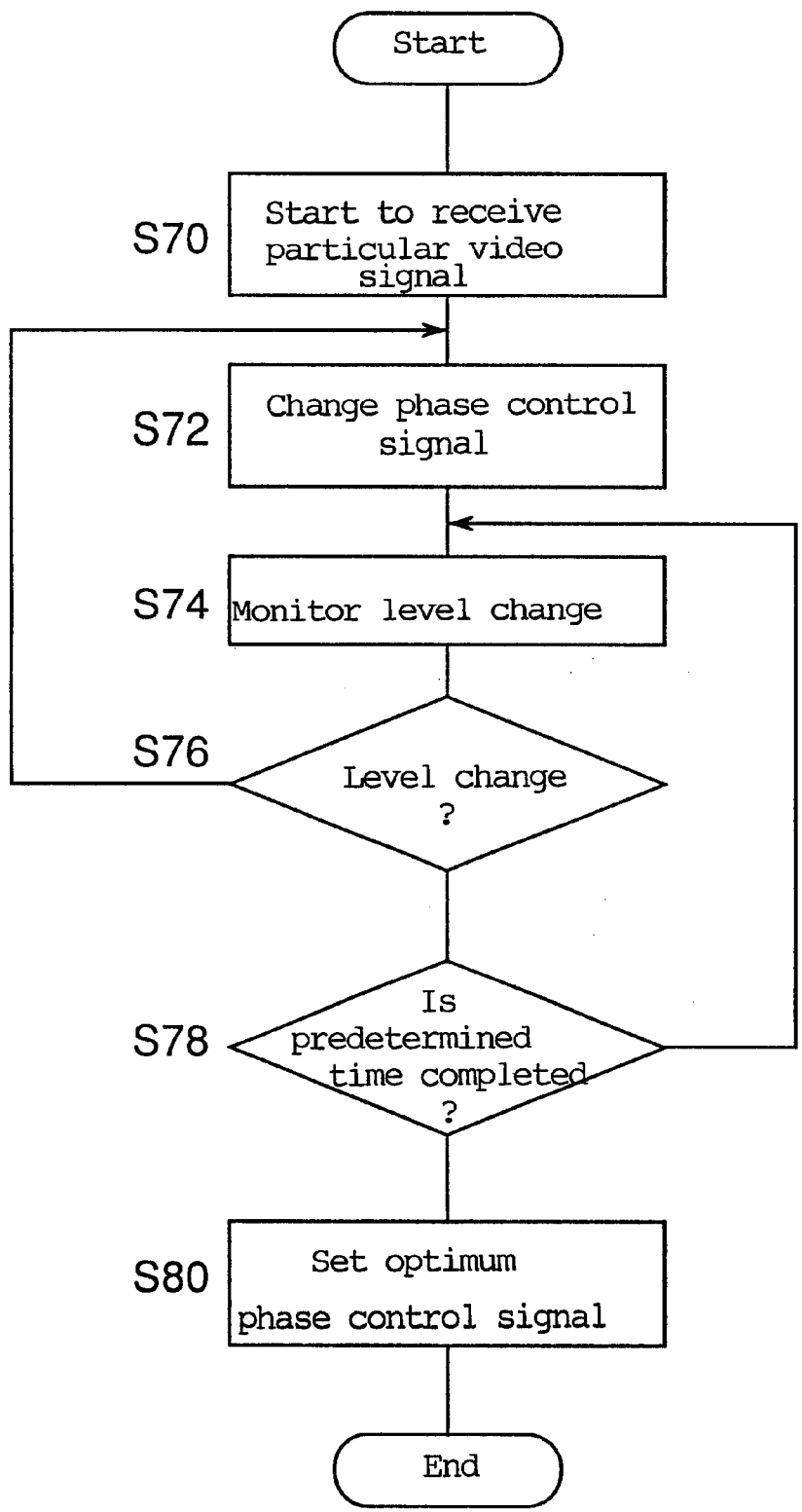
FIG. 12 is a flowchart of control of a fifth decision circuit.

FIG. 12 shows a flow of the control of a CPU in the fifth decider 38. First, the particular video signal 30 which changes between black and white at the period of sampling frequency is started to be received (step S70) Next, the phase control signal 90 on the phase of sampling clock signal is changed to be sent to the phase controller 5 (step S72). Next, level change is monitored on the signal subjected to the two-phase processing by the level change detectors 36, 37 (step S74), and it is decided whether level change occurs or not (step S76). When level change is detected, because the sampling point is bad, the flow returns to step S72 to set a next sampling phase to continue the monitoring. When no level change is detected, it is decided next whether a predetermined time is completed or not (step S78). If it is decided that the predetermined time is not completed, the flow returns to step S74 to continue the monitoring. If it is decided that the predetermined time is completed, it is decided to be an optimum sampling point, and the phase is set to the optimum sampling phase (step S80).

Although the present invention has been described in connection with the preferred embodiments thereof, it is to be noted that the scope of the invention is described in the appended claims and that various changes and modifications included therein are included in the present invention.

What is claimed is:

1. A video signal processing apparatus comprising:
    a clock generator which generates a sampling clock signal for digitizing a video signal based on an input synchronization signal;
    a phase controller which controls phase of the sampling clock signal at one of a plurality of phases in one period of the sampling clock signal;
    a first signal generator which generates a first signal when the input video signal is larger than a threshold level;
    a first counter which counts the first signal received from the first signal generator in a predetermined time;
    a second signal generator which generates a second signal when the input video signal is larger than another threshold level, at a timing according to the sampling clock signal controlled by said phase controller;
    a second counter which counts the second signal received from the second signal generator in the predetermined time; and
    a controller which makes said phase controller sequentially change the phase of the sampling clock signal in a period of the sampling clock signal, repeats the phase change over one or more periods of the sampling clock signal and sets the phase of the optimum sampling clock signal based on a difference between the output signals of said first and second counters obtained for each of the changed phases.

2. The video signal processing apparatus according to claim 1, wherein said first signal generator comprises a binarizing circuit which converts the input video signal to a bi-level signal, and said second signal generator comprises an analog-to-digital converter which digitizes the input video signal.

3. The video signal processing apparatus according to claim 1, wherein said controller sets a phase of the sampling clock signal, at which an absolute value of the count values of the first and second signals is equal to or smaller than a predetermined value, to the phase of optimum sampling clock signal.

4. The video signal processing apparatus according to claim 1, wherein said controller sets a phase of the sampling clock signal, at which an absolute value of the count values of the first and second signals is equal to or smaller than a predetermined value and the absolute value is smallest, to phase of optimum sampling clock signal.

5. The video signal processing apparatus according to claim 1, wherein said controller makes said phase controller change sequentially the phase of sampling clock signal in a period of the sampling clock signal, and when said controller continuously detects a phase of the sampling clock signal, at which an absolute value of count values of the first and second signals is equal to or smaller than a predetermined value, said controller sets a center value of the continuously detected phases of the sampling clock signal to the phase of optimum sampling clock signal.

6. The video signal processing apparatus according to claim 1, wherein said controller makes said phase controller change sequentially the phase of sampling clock signal in a period of the sampling clock signal, and when said controller detects two or more phases of the sampling clock signal, at which an absolute value of count values of the first and second signals becomes maximum, said controller sets a center value of the two or more phases of the sampling clock signal to the phase of optimum sampling clock signal.

7. The video signal processing apparatus according to claim 1, wherein said controller stops to control said phase controller when the output value of said first counter is equal to or smaller than a predetermined value.

8. The video signal processing apparatus according to claim 1, further comprising:
    a threshold level controller which controls the threshold level of said first signal generator; and
    a comparator which compares the output signal of said second signal generator with a different threshold level;
    wherein said controller decides whether the output value of said first counter is equal to or smaller than the predetermined level and decreases the threshold levels of said first signal generator and of said comparator when the output value of said first counter is equal to or smaller than the predetermined value.

9. A video signal processing method comprising the steps of:
    generating a sampling clock signal for digitizing a video signal based on an input synchronization signal;
    sequentially changing phase of the sampling clock signal at one of a plurality of phases in one period of the sampling clock signal, and repeating the phase setting over one or more periods of the sampling clock signal,
    wherein for each of the phase setting, the method comprising further the steps of:

generating a first signal when the input video signal is larger than a threshold level and counting the first signal in a predetermined time; and generating a second signal when the input video signal is larger than another threshold level at a timing according to the sampling clock signal and counting the second signal in a predetermined time; and setting a phase of optimum sampling clock signal based on differences between the count values obtained by repeating the phase change.

10. The video signal processing method according to claim 9, wherein the phase control is stopped when the count value of the first signal is decided to be equal to or smaller than a predetermined value.

11. The video signal processing method according to claim 9, wherein threshold levels for the first and second signals are decreased when the count value of the first signal is decided to be equal to or smaller than a predetermined value.

12. A video signal processing apparatus comprising:

a signal generator which binarizes an input video signal;

a clock generator which generates a sampling clock signal based on an input synchronization signal;

a phase controller which controls phase of the sampling clock signal at one of a plurality of phases in one period of the sampling clock signal;

a delay circuit which delays an output signal of said signal generator by on e sampling period;

a maximum detector which receives the output signal of said signal generator and that of said delay circuit and performs subtraction of the two output signals to provide a maximum value of the absolute value of the subtraction; and a controller which makes said phase controller sequentially change the phase of sampling clock signal by said phase controller in a period of the sampling clock signal, repeats the phase setting over one or more periods of the sampling clock signal to decide the largest value in distribution of maximum values detected by said maximum detector and sets the phase of the largest value to an optimum sampling point.

13. A video signal processing method comprising the steps:

generating a sampling clock signal which digitizes a video signal based on input synchronization signal;

sequentially changing phase of the sampling clock at one of a plurality of phases in one period of the sampling clock signal;

binarizing the input video signal;

delaying the binarized signal by one sampling period;

receiving the binarized signal and the delayed signal in a predetermined time and performs subtraction of the two output signals to detect a maximum value of the absolute value of subtraction; and deciding the largest value in distribution of the detected maximum values and setting the phase of the largest value to an optimum sampling point.

14. A video signal processing apparatus comprising:

a clock generator which generates a sampling clock signal based on an input synchronization signal;

a phase controller which controls phase of the sampling clock signal generated by said clock generator;

a signal generator which receives a video signal which changes alternately at a frequency of the sampling clock signal and binarizes the video signal at a timing of the sampling clock signal;

a two-phase processor which subjects an output signal of said signal generator to two-phase processing;

a plurality of level change detectors which detect the existence of level change for a plurality of output signals of said two-phase processor; and a controller which makes said phase controller change phase of the sampling clock sequentially and sets a phase, at which all of said level change detectors do not detect level change, to an optimum sampling point.

15. A video signal processing method comprising the steps:

generating a sampling clock signal for digitizing a video signal, based on an input synchronization signal;

changing phase of the sampling clock signal sequentially in a period of the sampling clock signal, and repeating the phase change over one or more periods of the sampling clock signal, wherein for each of phase change, a video signal which changes alternately at a frequency of the sampling clock signal is received, the video signal is binarized at a sampling timing of the sampling clock signal, the binarized signal is subjected to two-phase processing, and the level change is detected for a plurality of the output signals obtained in the two-phase processing; and setting a phase, at which the level change is not detected within a predetermined time among the plurality of the output signals obtained by repeating the phase change, to an optimum sampling point.

* * * * *

UNITED STATES PATENT AND TRADEMARK OFFICE
CERTIFICATE OF CORRECTION

PATENT NO. : 6,462,726 B1
DATED : October 8, 2002
INVENTOR(S) : Hamada et al.

It is certified that error appears in the above-identified patent and that said Letters Patent is hereby corrected as shown below:

Column 13,
Line 29, change "on e" to -- one --.

Column 14,
Line 28, change "all" to -- any --.
Lines 47-49, change "within a predetermined time among the plurality of the output signals obtained by repeating the phrase change" to -- for any of the output signals --.

Signed and Sealed this

Fourth Day of February, 2003

JAMES E. ROGAN
*Director of the United States Patent and Trademark Office*